(12) United States Patent
Neumann et al.

(10) Patent No.: US 7,877,105 B2
(45) Date of Patent: Jan. 25, 2011

(54) METHOD AND ARRANGEMENT FOR FREQUENCY SYNCHRONIZATION OF A MOBILE STATION WITH A BASE STATION IN A MOBILE COMMUNICATION SYSTEM

(75) Inventors: Markus Neumann, Nürnberg (DE); Wolfgang Wippich, Hersbruck (DE)

(73) Assignee: ST-Ericcson SA, Plan-les-Ouates (CH)

( * ) Notice: Subject to any disclaimer, the term of this patent is extended or adjusted under 35 U.S.C. 154(b) by 1338 days.

(21) Appl. No.: 10/562,875

(22) PCT Filed: Jun. 30, 2004

(86) PCT No.: PCT/IB2004/051065

§ 371 (c)(1),
(2), (4) Date: Dec. 29, 2005

(87) PCT Pub. No.: WO2005/004329

PCT Pub. Date: Jan. 13, 2005

(65) Prior Publication Data

US 2006/0234737 A1    Oct. 19, 2006

(30) Foreign Application Priority Data

Jul. 2, 2003    (EP)    .................................... 03101981

(51) Int. Cl.
*H04B 7/00*    (2006.01)

(52) U.S. Cl. .................. 455/502; 370/502; 342/357.12

(58) Field of Classification Search ................... 455/75, 455/115.1, 192.2, 255; 342/357.12, 357.1
See application file for complete search history.

(56) References Cited

U.S. PATENT DOCUMENTS

| 6,148,187 A | 11/2000 | Chiba |
| 6,278,867 B1 | 8/2001 | Northcutt et al. |
| 6,816,111 B2 * | 11/2004 | Krasner ................. 342/357.12 |
| 7,177,602 B2 * | 2/2007 | Ziren et al. ................... 455/75 |

FOREIGN PATENT DOCUMENTS

| EP | 1148642 A1 | 10/2001 |
| EP | 1241818 A1 | 9/2002 |
| GB | 2317281 A | 3/1998 |
| GB | 2354403 A | 3/2001 |
| WO | WO03032516 A1 | 4/2003 |

* cited by examiner

*Primary Examiner*—Phuoc Doan
(74) *Attorney, Agent, or Firm*—Robert Iannucci; Seed IP Law Group PLLC

(57) ABSTRACT

In a method for synchronizing a mobile station with the base station in a mobile communication system, a reference-frequency oscillator is re-adjusted. To enable an inexpensive reference-frequency oscillator of simple construction to be used, the frequency variations resulting from a change in the temperature of the mobile station and a change in its location are determined and/or predicted separately. When the frequency variations are large, the mobile station is synchronized with the base station more frequently than when they are small.

41 Claims, 8 Drawing Sheets

Characteristic curve

Key:
A = Positive Doppler shift
B = Negative Doppler shift
C = Difference in frequency between the two BTS's

METHOD AND ARRANGEMENT FOR FREQUENCY SYNCHRONIZATION OF A MOBILE STATION WITH A BASE STATION IN A MOBILE COMMUNICATION SYSTEM The invention relates to a method and an arrangement for synchronizing the carrier frequency of a mobile station with the carrier frequency of a base station in a cellular mobile communication system.

A method of this kind is described in GB patent 2 354 403 A. The mobile station senses ambient conditions, such as temperature for example. In an updatable table, conclusions relating to the frequency variance are drawn from the temperature. An AFC (automatic frequency control) algorithm is selected in line with the frequency variance. The frequency with which the synchronizing operations take place per unit of time remains unchanged. Changes in frequency that are caused by movements of the mobile station are not sensed separately. No analysis is made of the modes of operation of the mobile station.

In EP 1 241 818 A1 is described an automatic frequency control (AFC) by means of which an exact value of frequency is to be achieved as quickly as possible. No account is taken of ambient conditions or modes of operation.

In GB patent 2 317 281 is described an automatic frequency control in a mobile receiver, the purpose of which is to correct the frequency error as quickly and exactly as possible without any attention being paid to ambient conditions or modes of operation. No action is taken on the lengths of the AFC intervals.

Known from U.S. Pat. No. 6,148,187 is an automatic frequency control system. No separate allowance is made for a change in frequency caused by movement.

In U.S. Pat. No. 6,278,867, there is described a receiver having a loop for the automatic control of frequency. The gain of the loop is to be held constant. Allowance is made for temperature by means of a table that is updated during operation in a learning process. No provision is made for separate account to be taken of temperature-related or movement-related variations in frequency.

In the prior art, use is made in a mobile station of a complicated and expensive reference-frequency oscillator sub-assembly whose temperature-related variation in frequency is held, by provisions made in the circuitry, within close limits, which typically envisage a maximal variation in frequency from the nominal frequency in the operating temperature range of less than ±3 ppm.

It is an object of the invention, in a method and an arrangement of the kind specified in the opening paragraph and while using a reference-frequency oscillator sub-assembly that is inexpensive, simple in construction and non-temperature-compensated, to keep small the number of receiving operations for measuring the individual frequency variation when there are changes in temperature and changes in the location of the mobile station, which operations would otherwise need to be fairly frequent.

In accordance with the invention, the above object is achieved by virtue of the features of claim 1.

By the method described, the synchronization of the frequency of the mobile station is performed as a function of the variation in frequency, essentially in such a way that the length of the AFC measuring intervals can be kept long, by means of the AFC algorithm, when the frequency variations are small, and in this way the number of receiving operations per unit of time by the mobile station can be kept smaller than would be the case if the frequency variations measured or predicted were large. Hence the length of the AFC measuring interval, which is explained below, is adjusted to the current and/or expected requirements. Because each receiving operation involves a consumption of energy in the mobile station, the consumption of energy can be reduced by selecting a high length for the AFC measuring interval. The stand-by time of the mobile station is lengthened in this way.

By predicting critical temperature-related states and critical movement-related states, measurement and control can be performed in good time by means of additional receiving operations to prevent the network synchronization being lost. In the event of network synchronization being lost, complete resynchronization of the network would be necessary and this would result in high energy consumption and possibly in calls being cut short.

Because, in the method described, the length of the AFC measuring interval is matched to the requirements that exist at the time, use can be made of an inexpensive reference-frequency oscillator sub-assembly that operates without any special temperature compensation by hardware means and may thus have a pronounced characteristic curve for frequency vs. temperature. This makes the mobile station cheaper to construct.

Variations of the frequency of the mobile station from the frequency of the base station may occur as a result of changes in the temperature of the mobile station and/or movements of the mobile station relative to the base station. Frequency variations of these kinds are distinguished from one another.

Advantageous embodiments can be seen from the dependent claims.

An arrangement for carrying out the method can be seen in claims 28 and 29.

The method can be applied to all methods of multiplexing based on FDMA, TDMA, CDMA even though the terms used below are ones that are usually used for the GSM mobile communication standard. The term "dedicated mode" is to be understood as generalized to cover the mode of point-to-point communication by the mobile station with the base station and also to include the transmission of information for data services.

These and other aspects of the invention are apparent from and will be elucidated with reference to the embodiments described hereinafter.

Figure 1:
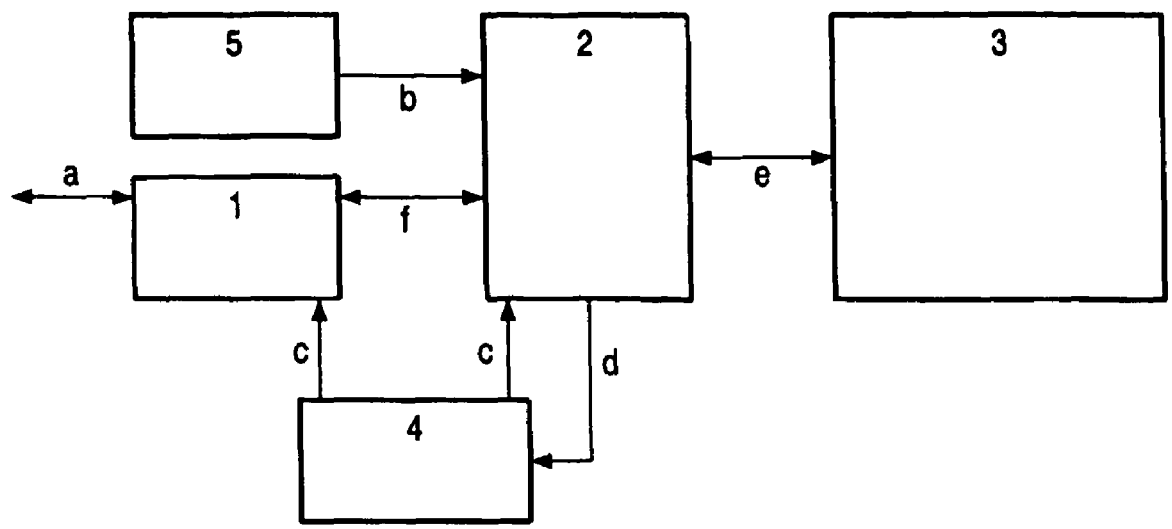
FIG. 1 shows components of a mobile station that are necessary for an understanding of the subject matter in the present case.
Figure 7:
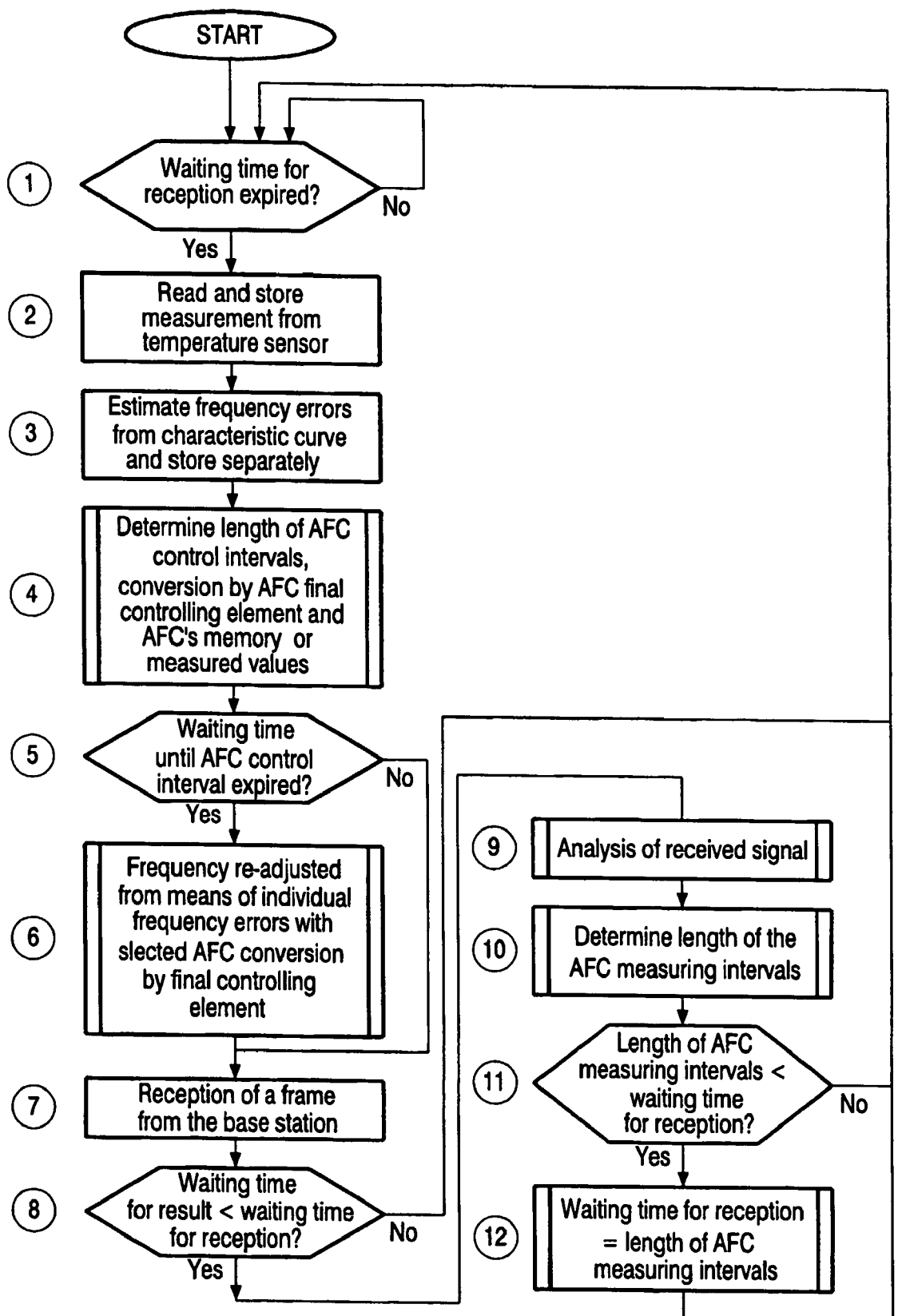

FIG. 7 is a flow chart for the operation of the AFC algorithm FIG. 8 to FIG. 11 are flow charts for blocks 4, 6, 9 and 10 of the flow chart shown in FIG. 7, A mobile station (see FIG. 1) has a transceiver arrangement 1 for radio signals a that are fed from or to a microprocessor 2 as radio data f. Associated with the microprocessor 2 is a non-volatile memory 3 that exchanges memory data e with the microprocessor 2. The AFC algorithm that is described is run on the microprocessor 2. A reference-frequency oscillator 4 acts as a frequency standard and generates a frequency c for the transceiver arrangement 1 and the microprocessor 2. The frequency of the reference-frequency oscillator 4 and the frequency with which the AFC measuring operations and the AFC control operations taken place per unit of time is set by the microprocessor 2 in response to the data from the memory 3.

A temperature sensor 5 senses the temperature of the mobile station and particularly that of the reference-frequency oscillator 4. The microprocessor 2 interrogates the temperature sensor 5 for the values measured for temperature. Associated with the temperature sensor 5 is an analog-to-digital converter to enable the microprocessor 2 to be supplied with the measured values in digital form.

The items of data from which the AFC algorithm performs the retuning of the frequency of the reference-frequency oscillator are stored in the memory 3. These items of data are, in particular: mode of operation (idle/dedicated), number of time slots occupied, individual frequency error, individual temperature-related frequency error, individual movement-related frequency error, total frequency error, absolute frequency error, absolute temperature, temperature gradient, values from table for characteristic curve, parameters of heating-up curve, received level, TOA (reception time of arrival) values, TA (transmission timing advance) values, and signal-to-noise ratio.

In the description, the terms frequency error and frequency variation are synonymous with one another.

The receiving arrangement 1 is activated for frequency retuning purposes in given AFC measuring intervals to receive and decode signals from the base station and to determine the frequency variation, i.e. the individual frequency error in the particular measuring interval. Under the mobile communication standard, the length of the AFC measuring intervals may not be more than a minimum to ensure that the mobile station is able to receive a paging signal.

There is generally more than one AFC measuring interval in an AFC control interval. The length of the AFC control interval defines a waiting time, after which the individual frequency errors measured are combined into a total frequency error and are analyzed. A weighted mean of the individual frequency errors is formed in this case.

A factor is decided on for the conversion by the final controlling element of the AFC. This factor determines how much account is taken of the total frequency error and to what degree it acts on the reference-frequency oscillator 4 as a controlling variable for the retuning of frequency. It is possible in this case for account to be taken of only a proportion of the total frequency error for the retuning of frequency by the final controlling element, or for a constant correcting value to be used. The retuning of frequency is performed, by means of the total frequency error once reduced by the conversion by the AFC final controlling element, additively as an addition to a retuning of frequency that has already been performed previously. The sum of all the frequency retunings made up to that point gives the absolute frequency retuning or in other words the absolute frequency error.

The transmission timing advance TA that is known in mobile communication systems states how much earlier the mobile station needs to transmit for the information transmitted to arrive at the base station at the right time. The transmission timing advance Tamil is requested from the base station by signaling. Hence the information on the transmission timing advance TA is only available and analyzable in the dedicated state. The transmission timing advance makes allowance for the local distance at which the mobile station is situated from the base station, with may be of a greater or lesser size at the time.

The reception time of arrival TOA, which is known in mobile communication systems, is generated by the mobile station as a result of its analyzing the signals received from the base station. The reception time of arrival TOA represents in this case the integral over time of the TOI information that is obtained in the mobile station and used to re-adjust the system timing. The information on the reception time of arrival TOA is available and able to be analyzed both in the dedicated state and in the idle state. The reception time of arrival TOA makes allowance for the local distance at which the mobile station is situated from the base station, with may be of a greater or lesser size at the time.

Figure 2:
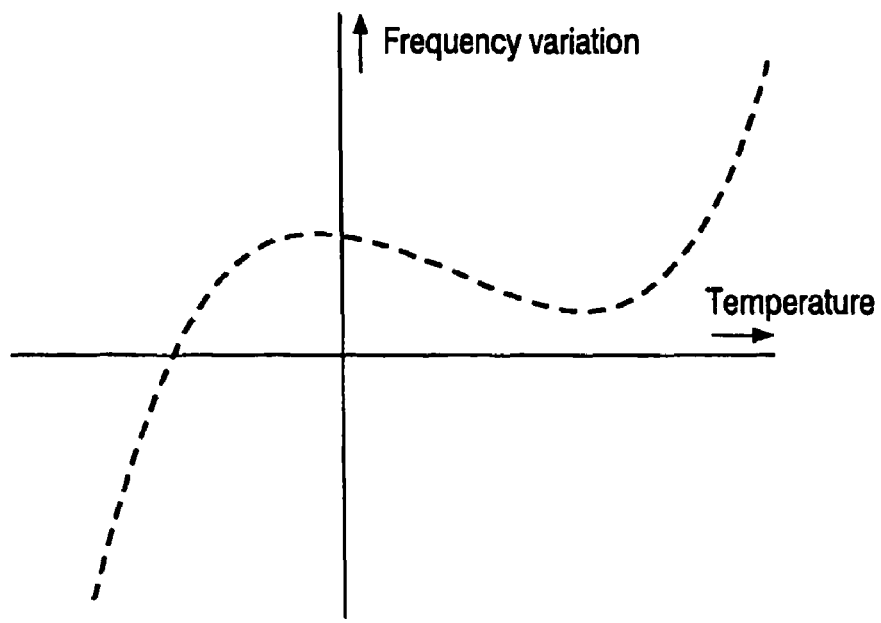
FIG. 2 shows a characteristic curve for a mobile station, which curve represents the dependence on temperature of the variation in the reference frequency of an oscillator belonging to the mobile station.

The individual characteristic curve (see FIG. 2) of a mobile station represents its frequency variation as a function of temperature. The curve varies from mobile station to mobile station but can be measured, and it is stored as a table in the memory 3. The characteristic curve is determined essentially by the reference-frequency oscillator 4 used. It is found by measurements made during production and/or by a teach-in process during the time in operation. When a reference-frequency oscillator of the kind normally used in mobile communications is used, the characteristic curve can be approximated by a third-order polynomial.

The pre-loading of the individual characteristic curve during production is performed in one of the following possible ways. Measurement of an adequate number of plotting points, or measurement of four plotting points and determination of the coefficient of the third-order polynomial, or measurement of one plotting point and translatory displacement of the typical characteristic curve by the difference from the value measured for the frequency error, or use of the typical characteristic curve without plotting points being measured.

Values that are missing from the table are interpolated linearly or by using the polynomial.

Figure 3:
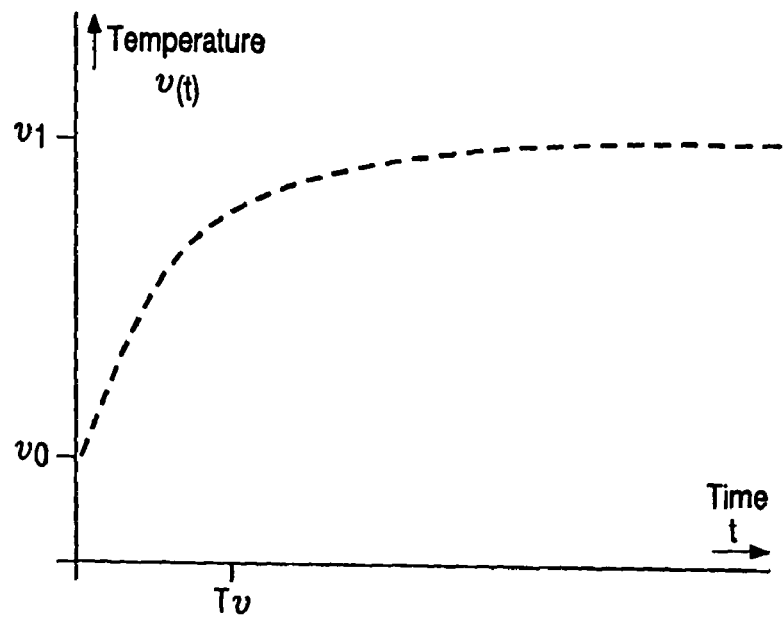
FIG. 3 is a heating-up curve for the mobile station, which curve represents the increase in temperature as a function of the time in operation in a mode of operation.

The heating-up curve (see FIG. 3) represents the heating-up of the reference-frequency oscillator 4 that takes place, as a result of the thermal inertia of the mobile station, when there is a change of modes of operation, such as, for example, from the idle to the dedicated mode, or when there is a change in ambient temperature. The heating-up curve being a thermal step-function response of the system, which system has a thermally integrating action, the formula that defines it follows an e function:

$$\upsilon(t) = \upsilon_1 - (\upsilon_1 - \upsilon_0)e^{\frac{t}{T_\upsilon}}$$

where $\upsilon_0$ is the temperature that exists prior to a change in temperature caused by a change in a mode of operation, $T_\upsilon$ is the thermal time constant of the heating-up process, which is preset by the physical thermal inertia of the sub-assembly and has been determined by experiment, and $\upsilon_1$ is the expected future temperature.

If for example there is a switch to the transmitting mode at a time to and a temperature $\upsilon_0$, then it can be predicted that at a time $T_1$ the temperature reached will be $\upsilon_1$.

The same is true of a "cooling-down" curve, which is not shown.

The parameters of the above formula for the heating-up curve are stored in the memory 3, specifically by storing its thermal time constant $T_\upsilon$. Taking the knowledge that exists of the heating-up curve, a prediction can be made of temperature, i.e. it can be predicted what change in temperature can be expected subsequently during the given mode of operation, where mode of operation means the current transmitted power and the number of time slots used for the transmitting mode.

By correlating the heating-up curve with the characteristic curve, it is possible to predict a frequency variation that can be expected.

The prediction of frequency also makes it possible for a correction of frequency to be performed in line with the expected values if there is a brief failure of reception at the base station. In this way, it is also possible to counteract the frequency drift caused by intrinsic heating-up and/or by changes in ambient temperature. By means of the AFC algorithm, the length of the AFC measuring interval is set to suit the prediction of frequency. When this is done, allowance is made for the fact that, when there are changes in temperature, the predicted frequency variation depends not only on the current temperature gradient but also on the region of the characteristic curve in which the predicted temperature is situated. In critical regions, i.e. regions where the characteristic curve is very steep, the length of the AFC measuring interval and/or AFC control interval is set to be shorter than in less critical regions. The re-adjustment of frequency therefore takes place correspondingly more often.

Due to the scatter affecting the components of the reference-frequency oscillator 4, points of inflection on the characteristic curve (see FIG. 2) may occur at considerably different temperatures. Therefore, in temperature ranges in which it is likely that points of inflection will occur, the length of the AFC measuring interval and/or AFC control interval is made shorter. This is done particularly when the given characteristic curve is not exactly known, i.e. when the exactness indicator is low.

After a certain period in operation, the characteristic curve will be exactly known as a result or a teach-in or learning process. The length of the AFC measuring interval and/or of the AFC control interval can be increased at points of inflection that are then exactly predictable, because the size of the frequency variation is only small in the region of the point of inflection. Hence, when the exactness indicator for the characteristic curve is high, the points of inflection are not particularly critical regions.

Figure 4:
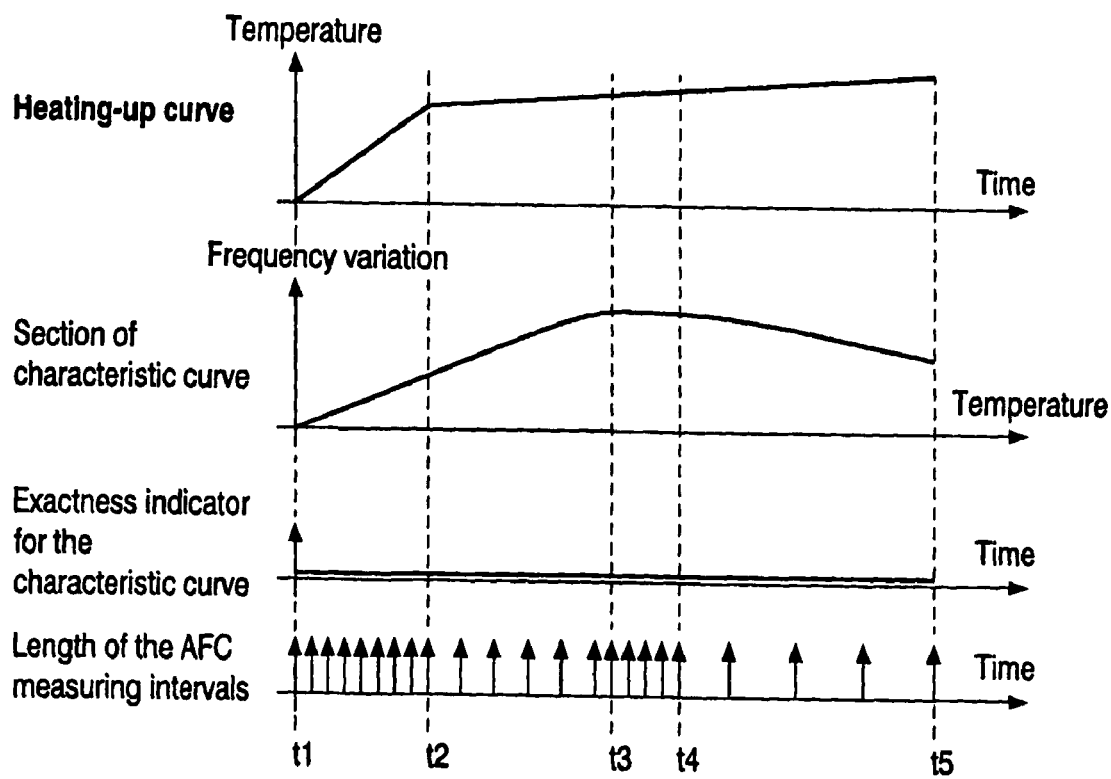
FIG. 4 shows lengths of AFC measuring interval as a function of a heating-up curve, and also a section of a characteristic curve having a low exactness indicator.

FIG. 4 shows by way of example the lengths of AFC measuring interval that are set between times t1 and t5. What is taken as a basis here is a heating-up curve that has been simplified as two straight lines and whose steepness decreases from time t2. It has also been assumed that the variation in temperature represented by the heating-up curve is in the section that is shown of the characteristic curve, the characteristic curve having a high positive gradient for the change in frequency per unit of change in temperature in the time range t1 to t3, a point of inflection in the time range t3 to t4, and a low negative gradient for the change in frequency per unit of change in temperature in the time range t4 to t5. It is also assumed that the exactness indicator for the characteristic curve is—as yet—only low.

Due to the steep gradient of the heating-up curve in the time range from t1 to t2 and the steep gradient of the characteristic curve in the associated temperature range, the length of the AFC measuring intervals is short from t1 to t2. Hence in graphic terms the times of measurement indicated by arrows on the time axis in FIG. 4 are close together.

In the time range from t2 to t3, the gradient of the heating-up curve is appreciably reduced. The length of the AFC measuring intervals is therefore increased in the time range from t2 to t3, which is represented graphically by longer distances between the arrows on the time axis (see FIG. 4). Hence, in the time range from t2 to t3, current consumption is lower than it would be if operations took place in the time range t2 to t3 with the same length of AFC measuring interval as exists in the time range from t1 to t2.

In the time range from t3 to t4, the length of the AFC measuring interval is very much shortened, because the characteristic curve is known with only low exactness and consequently the occurrence of the point of inflection can be predicted only roughly. The teach-in (learning) process is driven harder as a result of the shortening of the length of the AFC measuring interval, which means that more plotting points for the characteristic curve are generated in this region, which, under good reception conditions, means an increase in the level of the exactness indicator.

In the range from t4 to t5, due to the form of the heating-up curve there and to that of the characteristic curve in the associated temperature range, only a very small change in frequency need be expected. The length of the AFC measuring interval can therefore be set to a maximum. This length is greater than the length of the measuring interval in the time range from t2 to t3 and considerably longer than its length in the time range between t1 and t2. The maximum length corresponds to the minimum reception interval under the mobile communications standard and is preset thereby.

Figure 5:
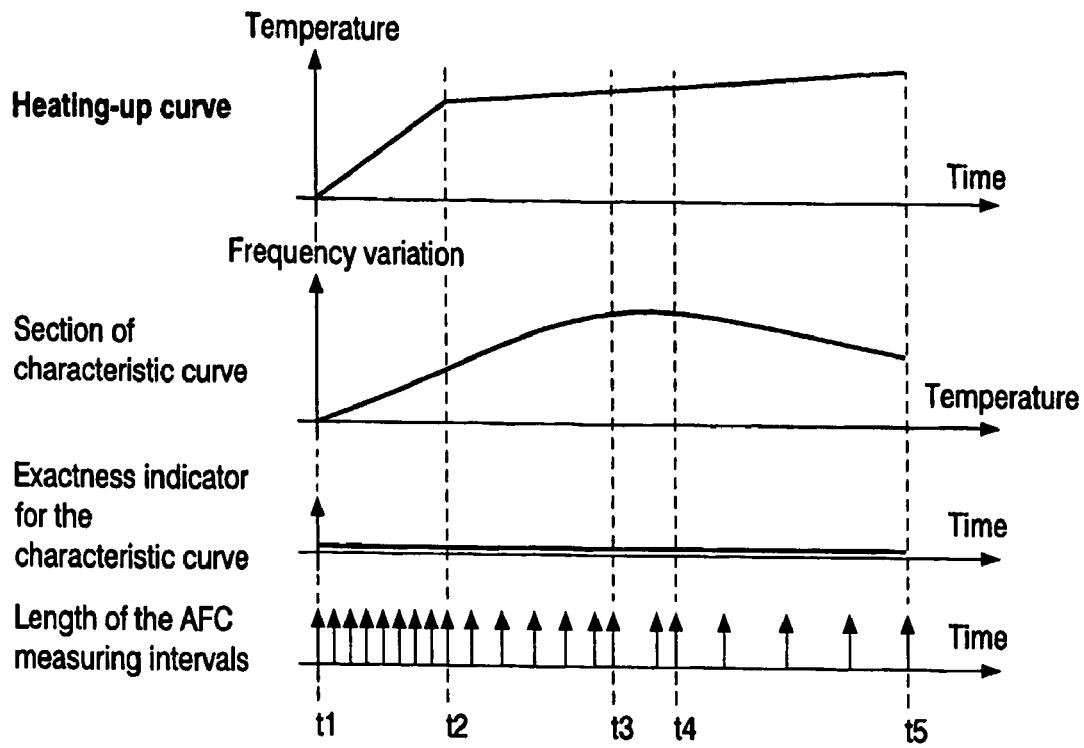
FIG. 5 is a representation corresponding to FIG. 4 when the exactness indicator for the characteristic curve is high.

The example in FIG. 5 corresponds to that in FIG. 4 except that in FIG. 5 it is assumed that the exactness indicator for the characteristic curve is high and the shape of the characteristic curve is therefore held in store with great exactness. This affects the setting of the length of the measuring interval particularly in the time range between t3 and t4. In this range, the length of the AFC measuring interval is increased in comparison with FIG. 4 because the frequency variation is only small in this range given that the point of inflection can be exactly predicted. In the mode of operation shown in FIG. 5, the saving on current is greater than in FIG. 4, because in FIG. 5 the length of the AFC measuring interval is also increased in the time range between t3 and t4.

As well as the temperature-related changes in frequency described above, what also occur in the mobile station are changes in frequency caused by its movement in the infrastructure, which changes are taken into account in the resetting of frequency, particularly in the setting of the length of the AFC measuring interval and/or the length of the AFC control interval.

When the mobile station moves in the cells of the infrastructure, there are two particularly critical cases that may occur and that result in jumps in the synchronization frequency emitted by the base station. These cases are case I, in which the mobile station travels past below a base station and case II in which the mobile station changes from the cell of a base station BTS1 to the cell of an adjoining base station BTS2 (see FIG. 6).

In case I (travel past) the sign of the Doppler shift changes because the mobile station approaches the base station up to the point where it travels past below the station and recedes from the base station after this point. At the time of the travel past, there is a jump in the frequency of the received synchronizing frequency in the mobile station of a size equal to up to twice the Doppler shift.

In case II (change of cell), the sign of the Doppler shift likewise changes, but this time because the mobile station has moved away from the base station BTS1 that had been determining frequency up to that time and is now approaching the adjacent base station BTS2. The difference in the synchronizing frequencies that exists between the two base stations also has an effect. In the worst case, the resulting jump in frequency may be a scalar addition of the twice the Doppler shift to the difference in frequency that exists between the two base stations. In the best case, the frequency errors may partially cancel each other out.

Whether it is case I (travel past) or case II (change of cell) that is expected at the time is determined by the mobile station by sensing the transmission timing advance (TA) and/or the reception time of arrival (TOA) at the time, and/or the received power at the time of the received synchronizing frequency (carrier frequency).

The mobile station distinguishes in this case between whether the mode in which it looks at the network over defined lengths of time is the dedicated mode, or the idle mode.

In the dedicated mode, case I (travel past) is predicted if the transmission timing advance (TA) and/or the reception time of arrival (TOA) are approaching a minimum and/or the received power exceeds a given level. This is done by means of the memory 3.

In the dedicated mode, case II (change of cell) is predicted if change-of-cell signaling, that causes a change of cell in the mobile station, occurs.

In the idle mode, case I (travel past) is predicted if the reception time of arrival (TOA) is approaching a minimum and/or the received power (received field strength) exceeds a given level.

In the idle mode, case II (change of cell) is predicted if a measurement of received power in one of the adjacent cells finds a higher power than in what had been—up till then—the home cell.

When the received power is being analyzed, suitable smoothing of the measurements is performed to suppress the effect of multi-path propagation.

If, as a result of the sensing that has been mentioned of the movements of the mobile station, jumps in frequency can be expected, then the length of the AFC measuring intervals is reduced to enable the mobile station to react quickly to jumps in frequency of this kind. If no such movement-related jumps in frequency are imminent, the length of the AFC measuring interval is increased, which helps to save current.

Figure 6:
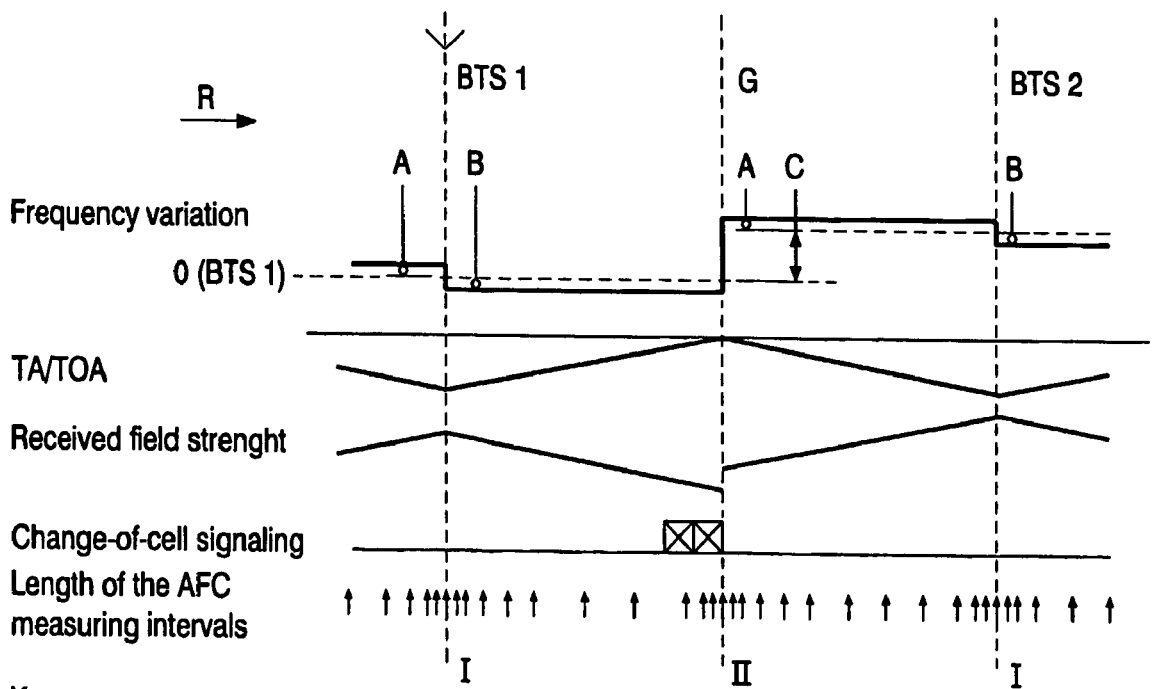
FIG. 6 shows lengths of AFC measuring interval as a function of changes in the location of the mobile station.

FIG. 6 shows an example of movement-related action taken on the length of the AFC measuring intervals. It is assumed that a mobile station moves at a constant speed and direction R relative to a base station BTS1 and travels past below the latter (case I), crosses the boundary G of the latter's cell (case II) and enters the cell of the adjacent base station BTS2 and travels past below this station (case 1).

When this movement takes place it produces the frequency variations shown in FIG. 6. In case I (travel past), the Doppler frequency A, which had been positive up till then, changes to a negative Doppler frequency B. The TA value or TOA value approaches a minimum. The received field strength increases.

These events are measured and the course they follow is stored and analyzed in the memory 3. They cause a shortening of the length of the AFC measuring intervals (see FIG. 6), which up to that time had been comparatively long to allow current to be saved in the mobile station. As far as the retuning of frequency is concerned, adequate account is taken of the jump in frequency by the shortening of the length of the AFC measuring interval.

After this, the length of the AFC measuring intervals is increased again (see FIG. 6), which again results in a saving in current.

In case II (change of cell), the positive Doppler shift A and the negative Doppler shift B occur again plus, in addition, a frequency difference C between the base station BTS1 and the base station BTS2. This results in an approach by the TA/TOA value to its maximum and a jump in the received field strength. In the dedicated mode the imminence of case II is indicated in advance by signaling to initiate the change of cell, and in the idle mode it is indicated by the measurement of higher received powers in the adjacent cell. These events are analyzed and result in a shortening of the length of the AFC measuring intervals (see FIG. 6), so that in this critical region too a retuning of frequency takes place that is adequate for the needs of operation.

When the mobile station travels past the base station BTS2, what happens is what was described above in connection with base station BTS1. In the region close to the station, the length of the AFC measuring intervals is reduced to allow the frequency variations to be adapted to quickly and after that it is increased, because of the absence of critical changes in frequency, to save current.

The measures described above can be arranged to co-operate as follows:

The length of the AFC measuring intervals may first be preset to a maximum length, which is required on the network and corresponds to the minimum reception interval. If events then occur that indicate that a large change in frequency can be expected, the length of the AFC measuring interval is reduced to suit.

On the one hand, these events are identified from the measurement that is made of temperature and temperature gradient and with the help of temperature prediction in connection with the heating-up curve and frequency prediction in connection with the characteristic curve. For this purpose, temperature is measured at sufficiently short intervals and is continuously available as information. Hence, what is determined is whether the absolute temperature is situated in critical regions of the characteristic curve and/or whether large temperature gradients are occurring at the time.

On the other hand, the detection of imminent, movement-related events produces, in the critical cases mentioned, a reduction in the length of the measuring intervals.

The reverse procedure is equally possible. A length for the AFC measuring interval that is initially short is increased when non-critical temperature ranges, minimal temperature gradients and no critical cases of movement are detected.

The temperature-related changes in frequency and the movement-related changes in frequency are superimposed on one another. The superimposition may take place in this case in such a way that the changes in frequency cancel each other out. When this is detected, the length of the AFC measuring intervals can be reduced.

If however the changes in frequency add to one another, the length of the AFC measuring interval has to be reduced accordingly. A change between the types of superimposition can for example be expected at the time of travel past below a station and at the time of a change of cell.

In the method described here, the individual frequency error that is measured is divided into an individual frequency error caused by temperature and an individual frequency error caused by movement and these two errors are stored separately in the memory 3.

The individual frequency error caused by temperature can be determined from the absolute temperature that is measured and the characteristic curve, to the extent that the latter is known.

The proportion of the individual frequency error that is represented by the Doppler shift (A, B) can be found by estimating the radial speed from the change in the TA and TOA values.

The speed-related and temperature-related frequency errors that have been determined or calculated in this way may be subjected to a plausibility check based on the maximum changes in speed that can be expected per unit of time and on realistic changes in temperature.

Also, a comparison can be made of the following laws to be followed in dividing the individual frequency errors into an individual frequency error caused by temperature and an individual frequency error caused by movement.

Unlike a movement-related change in frequency, a temperature-related change in frequency is always steady. Also, a temperature-related change in frequency is subject to more inertia than a movement-related change in frequency.

The characteristic curve can be determined and stored during operation by means of a teach-in or learning process. The individual characteristic curve is not exactly known at the outset in this case but is gradually constructed or made more exact during operation. As the time in operation increases, an increasing number of exact plotting points are obtained for the characteristic curve. Plotting points that are missing at the outset can, if required, be determined by approximation. When the mobile station is switched on for the first time, a typical characteristic curve that has been stored beforehand can be taken as a basis and can then be gradually adjusted to give the true characteristic curve.

When the teach-in or learning process is employed, the frequency tuning takes place as follows: at the beginning of each AFC operation, the expected value for the frequency retuning is preset as a starting value. This value is the result of the information that is already known regarding the characteristic curve and of the temperature that has been measured. The AFC operation then takes place and generates a new plotting point. A table is used that has temperature as a counter variable and the individual frequency error is transmitted to the memory under the following conditions a, b, c.

a. It is of advantage for the measured individual frequency errors that are taken into account to be solely ones that are based on the effects of temperature. In this way, results that are whole or partly attributable to the effects of movement can be discarded.

A more complicated and costly possibility is for controlling variables of which some are based on movement also to be taken into account. In this case, the frequency variation caused by movement can be estimated from the change in the value of the transmission timing advance TA or in the value of the reception time of arrival TOA, and the frequency variation caused exclusively by temperature can be calculated back to. However, it can be expected that the accuracy obtained with this option will be only limited. This option is therefore only useful when the values that are already known for the characteristic curve are of low exactness.

Because changes in frequency caused by movement and changes in frequency caused by temperature are sensed separately, it is possible for the above limitation exclusively to changes in frequency caused by temperature to be made.

b. New plotting points that are added in the teach-in process may be subjected to a plausibility check in which it is decided whether these new plotting points are to be taken into account or discarded. The plausibility check is based on plotting points that are already known on the individual characteristic curve or, when the mobile station is put into operation for the first time, on typical values for the characteristic curve and expected tolerance-related deviations from it.

c. After a long time in operation, it may happen that plotting points are generated that are already present in the memory and have the highest exactness indicator. By forming a mean, these are correlated with current plotting points for which the maximum exactness indicator has also been determined. When there are enough new plotting points available that have the maximum exactness indicator, the old plotting points are discarded. In this way a shift in the characteristic curve, caused for example by the effects of ageing, can be compensated for.

To improve the embodiments of the AFC algorithm, the conditions of reception are analyzed. The received field strength of the high-frequency signal and the signal-to-noise ratio (SNR) of the modulating signal are used for this purpose. An estimate of the exactness with which the frequency error is determined under the existing conditions is derived from these two items of information. This estimated value for exactness is included in the table mentioned as an attribute of the absolute frequency error.

In a movement-related critical state, the items of temperature information that were obtained in the past are used again, whereas all the preceding items of change-of-location information based on movements within the cell of the previous base station are discarded.

If there is a drastic change in ambient temperature, which always occurs unexpectedly, past movement-based frequency errors that were measured can be subjected to further processing, whereas older frequency errors based on the effects of temperature that were measured are discarded. The frequency error relating to the new temperature is then estimated using the characteristic curve.

In each of the AFC measuring intervals that are acted on as above as a function of temperature and movement, the individual frequency error that occurs is determined. One, or generally more than one, AFC measuring interval is situated in an AFC control interval. Hence there are generally a plurality of individual frequency errors available in an AFC control interval, which allows means to be formed of the individual frequency errors and the means to be combined to give a total frequency error, which means that not every individual frequency error has to be fed to the final controlling element for the retuning of the reference frequency.

The length of the AFC control interval affects the speed at which control takes place. When a fairly large change in frequency is predicted and the reception conditions are good, the length set for the AFC control interval is short, whereas when hardly any frequency changes are expected and the reception conditions are poor, the length set for the AFC control interval is long.

The stability of the control loop is affected by the conversion by the AFC final controlling element. What is meant by the conversion by the AFC final controlling element is a proportional reduction in the total frequency error. The total frequency error that is found to exist thus has to be proportionally reduced before it is fed to the final controlling element used for the frequency correction. Another possibility is for the readjustment of frequency to be limited to a constant value. When fairly large changes in frequency are predicted and the conditions of reception are good, a higher conversion by the AFC final controlling element is used, whereas when hardly any changes in frequency are expected and the conditions of reception are poor, a lower conversion by the AFC final controlling element is used. A small conversion by the AFC final controlling element corresponds to a large reduction in the total frequency error.

An adjustment of the memory that the AFC has of measured values affects the reaction of the control loop to disruptive factors. As soon as a jump in ambient temperature or a fast change in directional speed is detected, past segments of the relevant frequency errors are no longer taken into account for the formation of means.

Prediction of the frequency errors that can be expected in future is performed only for frequency errors caused by temperature. In the cases of changes in frequency caused by movement, their probability is detected and they are responded to by a shortening of the length of the AFC measuring interval.

Figure 8:
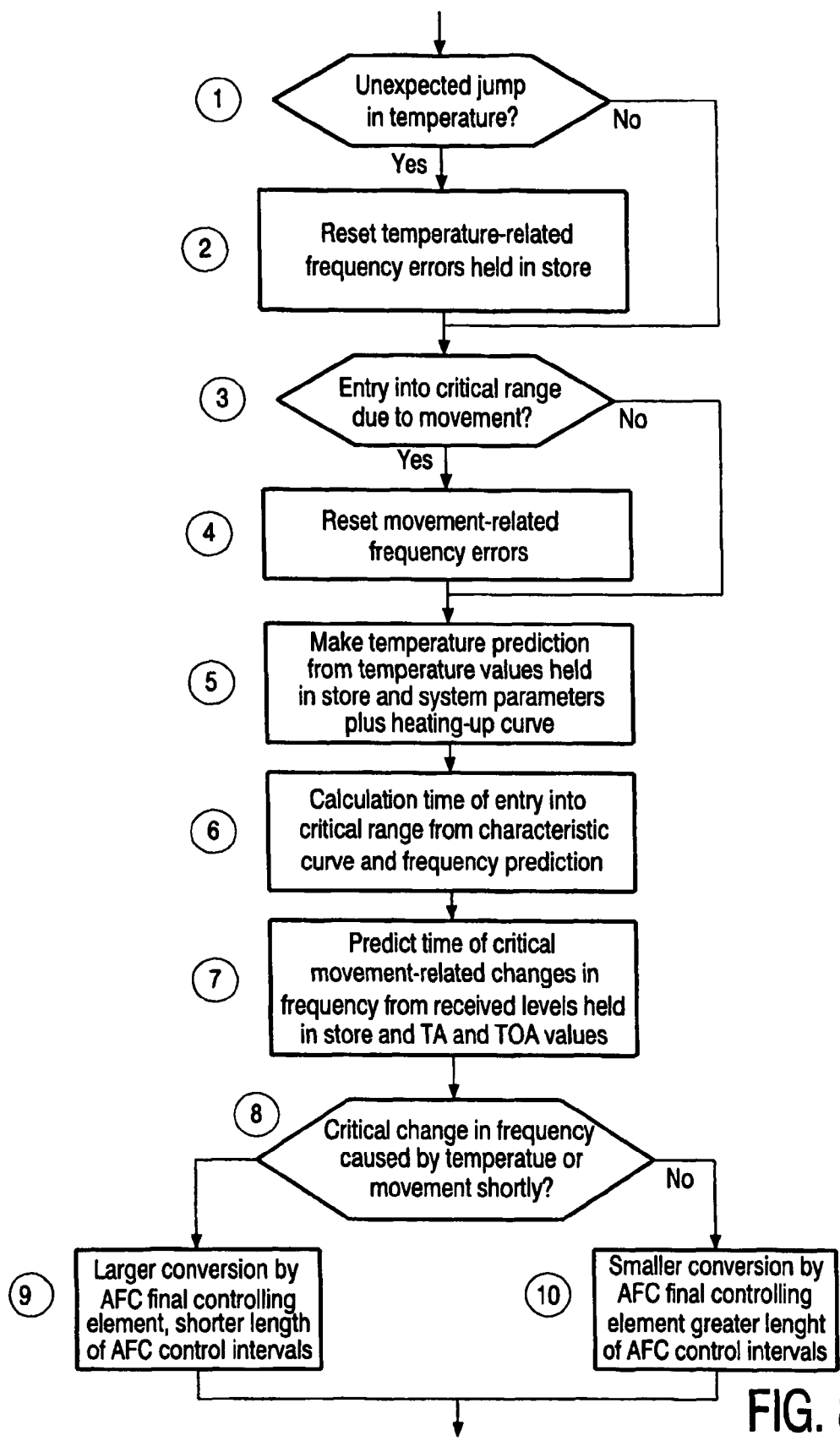
Figure 9:
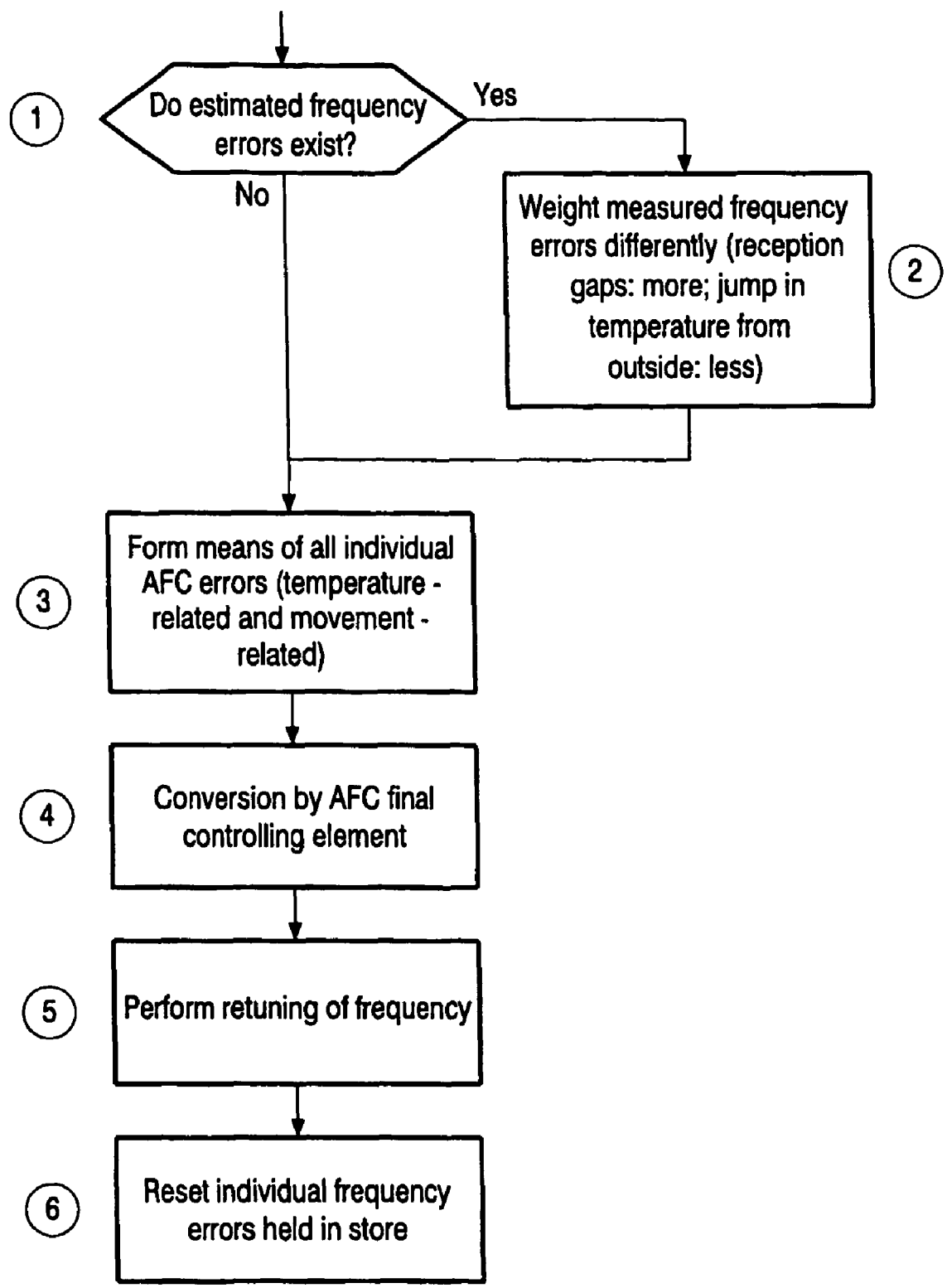
Figure 10:
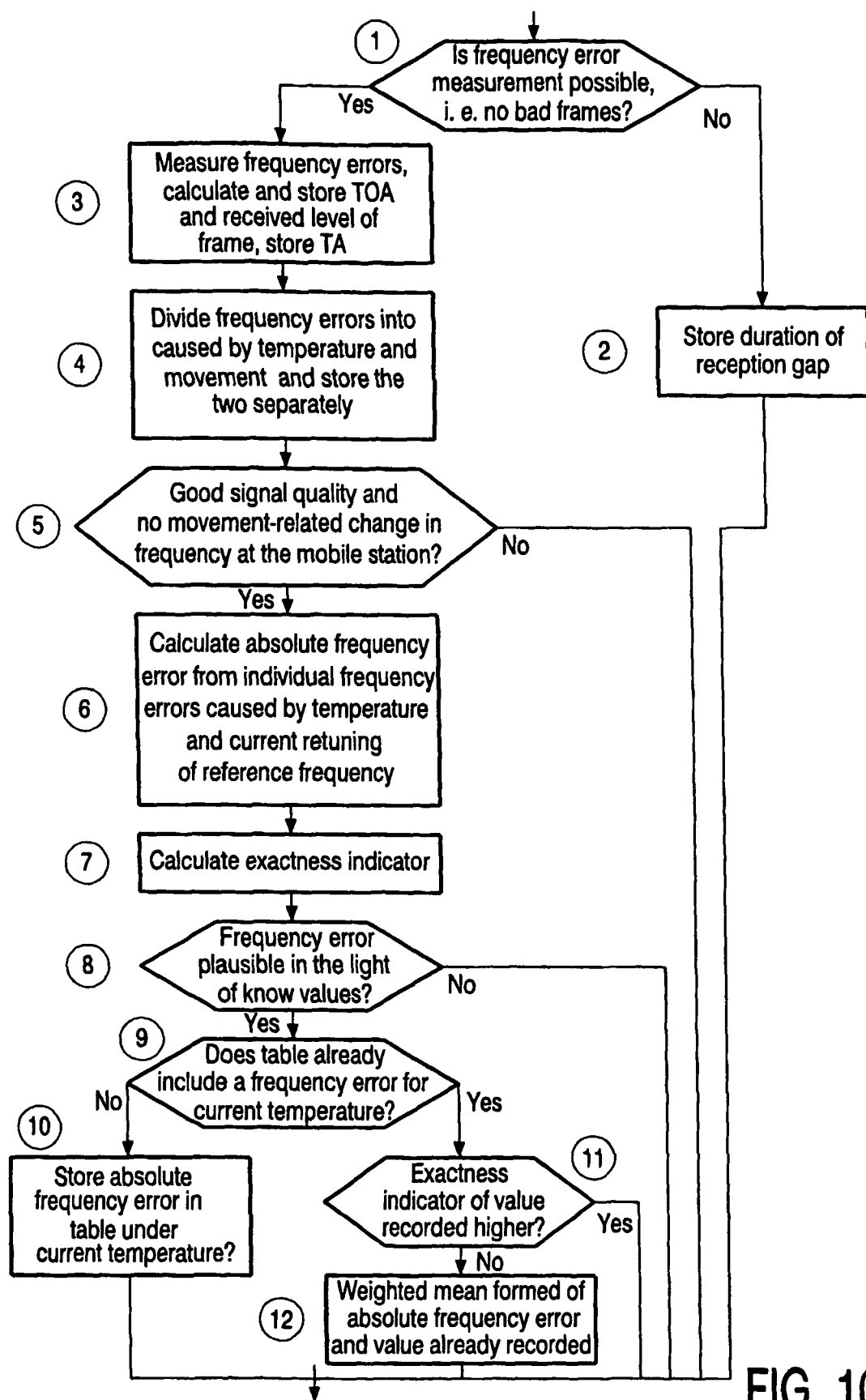
Figure 11:
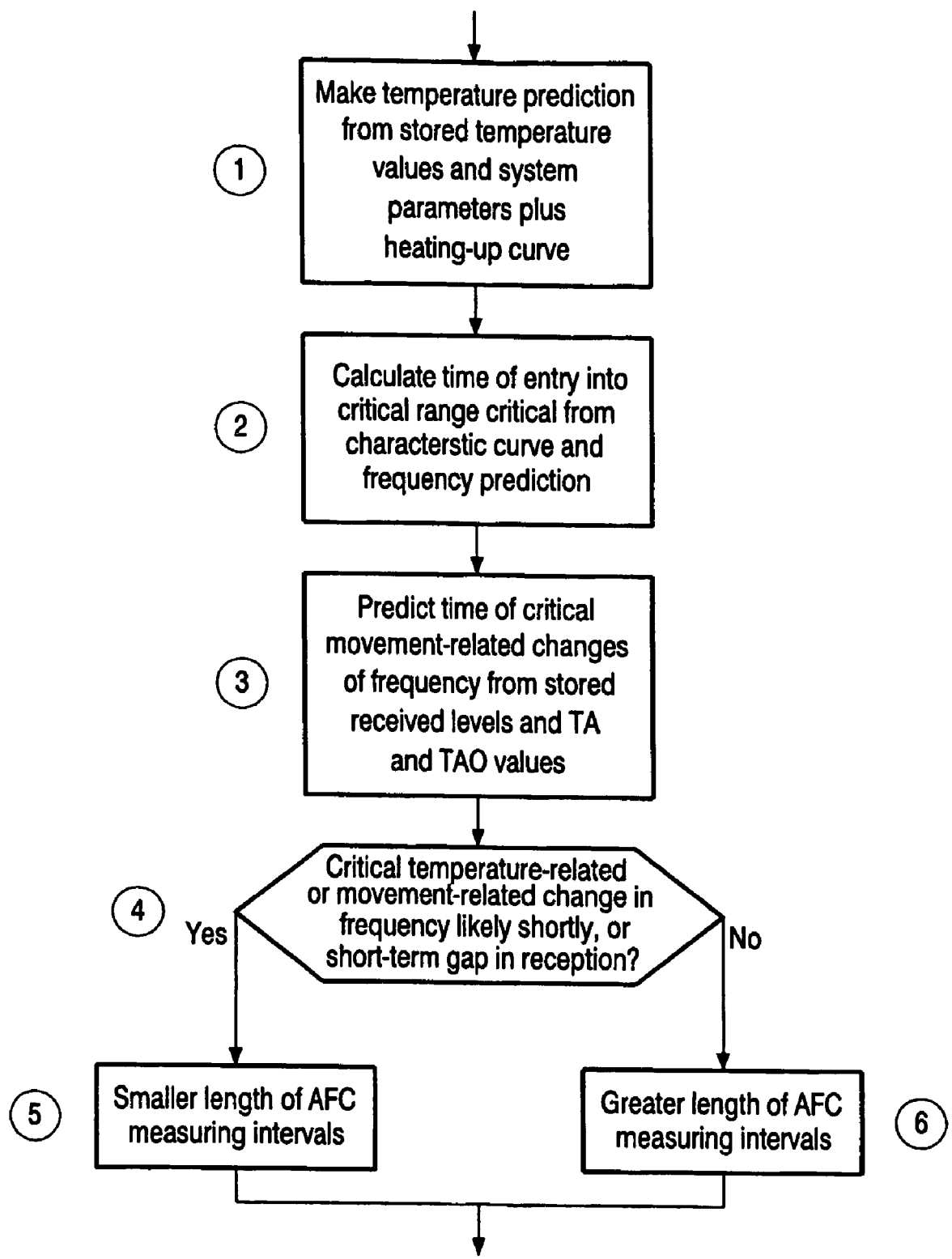

FIGS. 7 to 11 show flowcharts for the AFC algorithm that is run, with FIG. 7 being an overview while FIG. 8 shows block 4 of FIG. 7 in greater detail, FIG. 9 shows block 6 of FIG. 7 in greater detail, FIG. 10 shows block 9 of FIG. 7 in greater detail and FIG. 11 shows block 10 of FIG. 7 in greater detail.

The flowcharts are examples illustrating one possible embodiment of the concept according to the invention. There are however a large number of embodiments that are possible using the concept according to the invention.

What happens in block 1 in FIG. 7 is the following: before the mobile station receives from the base station the quantity of data (the frame) that is received by the base station during the unit of time and that is needed for determining the frequency error, a waiting time to the next reception must have expired. For operation in the idle mode, the waiting time is typically in the second range, e.g. 0.5-2.25 sec for GSM. In the case of GSM, this is followed by up to four intervals each of the same duration as one frame (4.615 ms). During the waiting time, the mobile station usually goes to an energy-saving state (the sleep mode). For operation in the dedicated mode, the waiting time is exactly equal to the duration of one frame, being for example 4.615 ms in the case of GSM and 10 ms in the case of UMTS.

In block 2, immediately before the reception of a frame is enabled, the temperature is read from the temperature sensor 5 to give a value for temperature that is as up-to-date as possible. This is beneficial because the temperature may change considerably as a result of external factors during a fairly long waiting time. The value for temperature is stored in the memory 3.

In block 3, the value for temperature that has been read and stored is taken, and the associated frequency error is read out or interpolated from the individual characteristic curve (see FIG. 2) that is known at that stage in the form of values in a table. The error is the result of the difference in time relative to the time at which a readjustment of frequency last took place. Estimation of the frequency error immediately before reception is advantageous to prevent reception from becoming impossible as a result of variations in frequency.

In block 4, the temperature values held in store and the reception parameters represented by the results obtained in the past when receiving signals from the base station are analyzed to allow the length of the AFC control interval, the conversion by the AFC final controlling element and the memory the AFC has of measured values to be determined.

In block 5, following the above analysis, a check is made to see whether or not AFC control is needed immediately because the waiting time to the expiry of the AFC control interval (typical value in the second range, e.g. 30 sec in the idle mode) has or has not expired.

If the waiting time has expired, the control in question is performed in block 6 with the conversion by the AFC final controlling element that has been determined from the individual frequency errors held in store. Otherwise, the block 6 is skipped.

In block 7 a frame is always received from the base station.

In block 8, a distinction is made between whether or not the waiting time for the result (typical value of for example the duration of one or two frames) is less than the waiting time for reception. If the result of reception will not be available until after a request is made for the reception of further frames, a return is made to block 1.

In block 9, an analysis is made of the received signal if the waiting time for the result is less than the waiting time for reception.

Then, in block 10, an updated length for the AFC measuring intervals is determined on the basis of the result of the analysis.

In block 11, a distinction is made as to whether or not the length of the AFC measuring interval is shorter than the waiting time for reception. If, as a result of the new length that has been determined for the AFC measuring interval, reception is not necessary before the time determined by the particular communications standard, such as GSM for example (the waiting time for reception), a switch is made straight back to block 1.

Otherwise, early reception is forced to occur in block 12 at the time marked by the length of the AFC measuring interval and processing continues with block 1. This case can occur in the idle mode, in which the waiting time until the next reception may be in the second range.

What happens in block 4 in FIG. 7 is, in detail, the following (see FIG. 8): in step 1, the value that has been measured for temperature at the time is compared with the values for temperature held in store. If there is a large difference from the value that is expected from the heating-up curve, a jump in temperature due to ambient temperature is detected.

If a jump in temperature of this kind is detected, then the temperature-related frequency errors are reset in the memory, to prevent individual frequency errors that were sensed under different temperature conditions from falsifying the result in a subsequent AFC control operation. If no jump in temperature is detected, then step 2 is skipped.

In step 3, a check is made to see whether entry into a movement-related critical range is very shortly imminent. This is the case when a change of cell or travel past below a base station is taking place, which is detected by analysis and by comparison of the received levels, items of TOA information and, where appropriate, items of TA information held in store with the related current values.

If entry into a movement-related critical range is detected then, in step 4, the movement-related frequency error is reset in the memory 4 to prevent individual frequency errors that are based on movements from falsifying the result in the subsequent AFC control operation. If entry into a movement-related critical range is not detected, then step 4 is skipped. In step 5, a prediction of the temperature expected is made as a function of time with the help of the heating-up curve, using the values for temperature held in store and the known system parameters that affect temperature, such as transmitting mode of operation, transmitted power, and number of time slots in TDMA-based networks.

In step 6, the items of information determined in step 5 are analyzed by determining from the characteristic curve whether, and if so when, entry into a temperature-related critical range can be expected.

In step 7, the time of an imminent change of cell is estimated from the stored received level, and the time of a movement past the base station is estimated from the TOA value and, where applicable, the TA value. In both cases, what is indicated is the time of a critical, movement-related change in frequency.

In step 8, by analyzing the times determined in step 6 and step 7, a check is made for the possibility of imminent entry into a temperature-related or movement-related critical range, or the possibility of a jump in temperature that requires immediate controlling action to be taken, or the possibility of a large total frequency error.

If any of the above conditions exist, in step 9 the conversion by the AFC final controlling element is increased and the length of the AFC control interval reduced. What is achieved by so doing is that the control by the AFC is exerted even before the critical range is entered and the frequency error that has been found is more powerfully counteracted.

If the conditions specified in block 8 do not exist, in step 10 the conversion by the AFC final controlling element is reduced and the length of the AFC control interval increased.

What happens in block 6 in FIG. 7 is, in detail, the following (see FIG. 9): In step 1, a check is made to see whether, in addition to the frequency error measured, estimated frequency errors have also been stored.

If they have, the frequency errors measured can then be differently weighted in step 2. For example, in the case of gaps in reception the frequency errors measured can be more heavily weighted than the estimated frequency errors. If they have not, then step 2 is skipped.

In step 3, means are formed for all the temperature-related and movement-related individual frequency errors that have been stored. In this case the individual frequency errors may be weighted with an exactness indicator such as, for example, the signal-to-noise ratio (SNR) that exists in the given case. The particular signal amplitude (received power) can also be used as a weighting factor.

In step 4, the degree of control is specified, in the light of the total frequency error determined, by means of the previously determined conversion by the AFC final controlling element.

In step 5, this control of frequency, i.e. the retuning of frequency, is carried out by means of an output to the final controlling element.

In step 6, the individual frequency errors that are held in store are reset.

In block 9 in FIG. 7, which is shown in detail in FIG. 10, the received signal is analyzed. What is done in this case is that in step 1, as soon as the analysis of the received signal has taken place, it is established whether the quality of the signal is sufficiently good to allow a measurement of frequency error to be made.

If a measurement of frequency error is not possible, it is detected in step 2 that a gap in reception exists and the duration of the gap in reception is determined. This brings the analysis to an end. If the measurement of frequency error is possible, then in step 3 the following parameters are calculated and stored: frequency error, TOA signal, received level of the frame and TA value.

Then, in step 4, the particular frequency variation or frequency error is divided into the frequency error caused by temperature and the frequency error caused by movement and the two are stored separately. This can be done by calculating the temperature-related error by interpolation from the known values held in store if a large number of values on the characteristic curve have already been stored previously. A split between temperature-related frequency errors and movement-related frequency errors can also be made by detecting the radial speed of the mobile station relative to the base station and using the resulting Doppler function. The speed-related and temperature-related frequency errors that have been determined or calculated in this way may be subjected to a plausibility check in the light of the maximum changes in speed and changes in temperature that can be expected per unit of time.

In step 5 of FIG. 10, an assessment is made to see that the signal quality is good and that there is not a movement-related change in frequency present at the mobile station. If this is not the case, the analysis is brought to an end.

Otherwise, following step 5, the teach-in algorithm for the characteristic curve is initiated in step 6. For this purpose the absolute frequency error caused by temperature, which is obtained from the current retuning of the reference frequency and from the individual frequency error caused by temperature that is measured, is determined.

In block 7, the exactness indicator for the frequency variation is determined, by reference, for example, to the signal-to-noise ratio (SNR) and/or the received power.

In step 8, a check is performed against values of the characteristic curve that have already been stored to determine whether the absolute frequency error caused by temperature is plausible, i.e. deviates by only a small amount from the interpolated value obtained from values that are already known. If this is not the case, the analysis is terminated.

Otherwise, a check is made in step 9 to see whether a stored entry on the characteristic curve already exists for the value of temperature that has been determined.

If this is not the case, in step 9 the absolute frequency error caused by temperature is stored, together with the value of temperature that has been determined and the exactness indicator.

Otherwise, the exactness indicator held in store is compared in step 11 with the exactness indicator determined. If it is higher than the latter, the analysis is terminated.

Otherwise, a weighted mean is formed for the absolute frequency error caused by temperature with the value already recorded, and is stored. A new exactness indicator is also determined and stored.

In block 10 in FIG. 7 the length of the AFC measuring interval is determined. This process is shown in detail in the flowchart that appears in FIG. 11.

In step 1 of FIG. 11, a prediction of the temperature expected as a function of time is made with the help of the values for temperature held in store and the known system parameters that affect temperature, such as the type of transmission mode (dedicated mode, idle mode), the transmitted power, and the number of timeslots in TDMA-based systems.

In step 2, it is calculated from the data obtained in step 1 and from the characteristic curve (see FIG. 2), whether entry into a temperature-related critical range can be expected, and if so when.

In step 3, the time of an imminent change of cell is determined from the signaling detected or from a measurement of the received power in the adjacent cell which, as described above, is done by reference to the received level held in store, the TOA information and where appropriate the TA information relating to travel past below a base station.

In step 4, a check is made for the possibility of a critical change in temperature caused by temperature or movement taking place shortly. It is also determined whether there is a gap in reception, which has not yet lasted for any length of time.

In step 5, the AFC measuring interval is set to a shorter length if either of the possibilities checked for exists.

If neither of the possibilities checked for exists, in step 6 the AFC measuring interval is set to a greater length. In this way, the energy consumption in the idle mode of operation can be reduced, with signals from the base station being received only at the times laid down by the particular network standard.

The invention claimed is:

1. A machine-implemented method, comprising:
    synchronizing a carrier signal of a mobile station with a carrier signal of a base station in a cellular mobile communication system, the synchronizing including:

determining or predicting a frequency variation that occurs in the mobile station due to a change in the temperature of the mobile station; and determining or predicting, separately from determining or predicting the frequency variation that occurs in the mobile station due to a change in the temperature of the mobile station, a frequency variation that occurs when there is a change in location of the mobile station relative to the base station; and when a large frequency variation is determined or predicted, synchronizing, using an AFC algorithm, a carrier frequency of the carrier signal of the mobile station with a carrier frequency of the carrier signal of the base station more frequently than is the case when a small frequency variation is determined or predicted.

2. A method as claimed in claim 1, comprising making a distinction in the mobile station between whether the frequency variation is due to a change in temperature or to a change in location, the making including making a distinction between the proportion of the frequency variation that is due to a change in temperature and the proportion that is due to a change in location.

3. A method as claimed in claim 2, wherein making the distinction includes determining whether the course followed by the frequency variation is steady or abrupt.

4. A method as claimed in claim 1, comprising processing together the frequency variations that result from a change in temperature and/or a change in location, the processing including detecting canceling out by superimposition.

5. A method as claimed in claim 1, comprising obtaining in the mobile station a measured variable from which conclusions are drawn as to the absolute temperature of the mobile station.

6. A method as claimed in claim 5, comprising determining a time-based temperature gradient from measured variables.

7. A method as claimed in claim 5, comprising storing in the mobile station a curve for the frequency variation as a function of temperature, which curve is characteristic of the mobile station, the storing including storing the curve as a table such that a value corresponding to an expected change in frequency can be read out from this table.

8. A method as claimed in claim 7, comprising storing in the table an exactness indicator that indicates how high a probability is of the value stored in the table matching an actual current shape of the characteristic curve.

9. A method as claimed in claim 8, comprising, when manufacturing the mobile station, preloading the table with values for a typical, known characteristic curve without any measurements.

10. A method as claimed in claim 8, wherein values of the table that are preloaded at the time of manufacture have a lower exactness indicator and values measured when a standard of reception is good have a high exactness indicator, the method comprising replacing values having a low exactness indicator by values having a high exactness indicator.

11. A method as claimed in claim 7, comprising, when manufacturing the mobile station, preloading the table by measuring certain plotting points on the characteristic curve, or by shifting a typical, known characteristic curve in translation by an additive value that has been obtained by measuring a single plotting point.

12. A method as claimed in claim 7, comprising determining or updating the individual characteristic curve by teach-in processes during the operation of the mobile station.

13. A method as claimed in claim 1, comprising storing in the mobile station a heating-up curve that is typical of the mobile station and that represents operation-related changes in temperature with time, the storing including storing the heating-up curve as a table or as parameters of an exponential function of the heating-up curve, from which an expected change in temperature can be estimated in advance.

14. A method as claimed in claim 13, wherein determining and/or predicting the frequency variation that occurs in the mobile station due to a change in the temperature of the mobile station includes estimating in, advance the frequency variation that occurs in the mobile station due to a change in the temperature of the mobile station by correlating the heating-up curve with a characteristic curve.

15. A method as claimed in claim 1, comprising identifying in advance critical states that affect temperature, wherein determining and/or predicting the frequency variation that occurs in the mobile station due to a change in the temperature of the mobile station includes estimating frequency variations based on the identified critical states.

16. A method as claimed in claim 1, wherein determining and/or predicting the frequency variation that occurs in the mobile station due to a change in the temperature of the mobile station includes estimating a temperature-related frequency error before any measurement of the frequency error.

17. A method as claimed in claim 1, comprising, when measurements of the frequency variation are not possible due to poor reception conditions, estimating a temperature-related frequency error and taking into account the temperature-related frequency error during the synchronizing.

18. A method as claimed in claim 1, wherein determining and/or predicting the frequency variation that occurs in the mobile station due to a change in the temperature of the mobile station includes, before measuring actual temperature changes or frequency variation, estimating the change in temperature to be caused by a mode of operation of the mobile station, wherein estimating the change in temperature to be caused by the mode of operation includes estimating the change in temperature to be caused by transmitted power and/or, in the case of a TDMA-based mobile station, the number of time slots occupied in a transmitting mode.

19. A method as claimed in claim 1, comprising determining in advance a probability of an imminent jump in frequency, the determining including:

determining the probability of imminent travel past and below the base station, and determining the probability of an imminent change of cells.

20. A method as claimed in claim 19, wherein determining the probability of imminent travel past and below the base station includes:

determining the probability in an idle mode from a change in a reception time of arrival and/or from a received power on a reception frequency, and determining the probability in a dedicated mode from a change in a transmission timing advance and from a change in a reception time of arrival and/or from a received power on a reception frequency.

21. A method as claimed in claim 19, wherein determining the probability of imminent travel past and below the base station includes:

determining the probability in an idle mode based on a reception time of arrival approaching a minimum and/or a received power on a reception frequency exceeding a threshold level, determining the probability in a dedicated mode based on a transmission timing advance approaching a minimum, based on a reception time of arrival approaching a minimum and/or a received power on a reception frequency exceeding a threshold level.

22. A method as claimed in claim 19, wherein determining the probability of an imminent change of cell includes:
- determining the probability in an in an idle mode from a power measured in adjacent cells, and
- determining the probability in a dedicated mode from signaling to initiate a change of cell and from a power measured in adjacent cells.

23. A method as claimed in claim 1, comprising:
- measuring current reception conditions, including received field strength and/or a signal-to-noise ratio of a received signal, and
- deriving, from the measuring, control parameters, including a length of an AFC control interval, a conversion by an AFC final controlling element, and an exactness indicator.

24. A method as claimed in claim 1, wherein the AFC algorithm adjusts a length of AFC measuring intervals as a function of a size of past and expected changes in frequency, and/or when critical states of change of location and/or critical states that affect temperature are predicted.

25. A method as claimed in claim 1, wherein the AFC algorithm adjusts a length of an AFC control interval as a function of a size of past and expected changes in frequency, and/or when critical states of change of location and/or critical states that affect temperature are predicted, and/or when reception conditions are good.

26. A method as claimed in claim 1, wherein the AFC algorithm adjusts a frequency conversion by a AFC final controlling element as a function of a size of past and expected changes in frequency, and/or when critical states of change of location and/or critical states that affect temperature are predicted, and/or when reception conditions are good.

27. A method as claimed in claim 1, wherein the AFC algorithm adjusts a memory of measured values as a function of a size of past and expected changes in frequency, and/or when critical states of change of location and/or critical states that affect temperature are predicted, and/or when reception conditions are good.

28. A method as claimed in claim 1, wherein the synchronizing includes re-adjusting a reference-frequency oscillator that has no temperature- compensating circuitry and that has an individual characteristic curve having a maximum frequency variation from a nominal frequency of more than +/−3 ppm in an operating temperature range.

29. A method as claimed in claim 28, comprising measuring a temperature of the reference-frequency oscillator using a temperature sensor.

30. A method as claimed in claim 1 wherein the synchronizing includes re-adjusting a reference-frequency oscillator using a controlling element.

31. A method as claimed in claim 1 wherein determining and/or predicting the frequency variation that occurs in the mobile station due to a change in the temperature of the mobile station includes determining the change in temperature of the mobile station using a temperature sensor.

32. A method as claimed in claim 1 wherein the synchronizing is controlled by a mobile station processor configured to implement the determining and/or predicting steps.

33. A method as claimed in claim 1, further comprising: receiving an input signal from the base station at a transceiver of the mobile station, wherein determining and/or predicting the frequency variation that occurs when there is a change in location of the mobile station relative to the base station includes a mobile station processor determining the frequency variation that occurs when there is a change in location of the mobile station relative to the base station based on the input signal received at the transceiver.

34. A mobile station, comprising:
- a reference-frequency oscillator configured to provide a carrier signal with a carrier frequency; and
- a controlling element configured to re-adjust the reference-frequency oscillator and synchronize the carrier frequency of the reference-frequency oscillator with a carrier frequency of a base station, the controlling element including:
- means for determining or predicting a frequency variation that occurs in the mobile station due to a change in the temperature of the mobile station separately from determining or predicting a frequency variation that occurs when there is a change in the location of the mobile station relative to the base station; and
- synchronizing means for synchronizing the carrier frequency of the reference-frequency oscillator with a carrier frequency of a base station using an AFC algorithm, the synchronizing means synchronizing the carrier frequency of the reference-frequency oscillator with a carrier frequency of a base station more frequently when a large frequency variation is determined or predicted than is the case when a small frequency variation is determined or predicted.

35. A mobile station as claimed in claim 34, wherein the controlling element includes means for making a distinction in the mobile station between whether the frequency variation is due to a change in temperature or to a change in location, including making a distinction between the proportion of the frequency variation that is due to a change in temperature and the proportion that is due to a change in location.

36. A mobile station as claimed in claim 34, wherein the controlling element includes means for processing together the frequency variations that result from a change in temperature and/or a change in location, the processing including detecting canceling out by superimposition.

37. A mobile station as claimed in claim 34, wherein the controlling element includes means for storing in a memory of the mobile station a curve for the frequency variation as a function of temperature, which curve is characteristic of the mobile station, the means for storing including means for storing the curve as a table such that a value corresponding to an expected change in frequency can be read out from this table.

38. A microprocessor for a mobile station, the microprocessor comprising:
- means for determining or predicting separately a frequency variation that occurs in the mobile station due to a change in the temperature of the mobile station and a frequency variation that occurs when there is a change in the location of the mobile station relative to a base station and
- synchronizing means for synchronizing a carrier frequency of a reference- frequency oscillator with a carrier frequency of the base station using an AFC algorithm, the synchronizing means synchronizing the carrier frequency of the reference-frequency oscillator with a carrier frequency of a base station more frequently when a large frequency variation is determined or predicted than is the case when a small frequency variation is determined or predicted.

39. A microprocessor as claimed in claim 38, comprising means for making a distinction in the mobile station between whether the frequency variation is due to a change in temperature or to a change in location, including making a distinction between the proportion of the frequency variation that is due to a change in temperature and the proportion that is due to a change in location.

40. A microprocessor as claimed in claim 38, comprising means for processing together the frequency variations that result from a change in temperature and/or a change in location, the processing including detecting canceling out by superimposition.

41. A microprocessor as claimed in claim 38, comprising means for storing in a memory of the mobile station a curve for the frequency variation as a function of temperature, which curve is characteristic of the mobile station, the means for storing including means for storing the curve as a table such that a value corresponding to an expected change in frequency can be read out from this table.

\* \* \* \* \*